(12) United States Patent
Farmer et al.

(10) Patent No.: US 6,497,239 B2
(45) Date of Patent: Dec. 24, 2002

(54) INVERTED PRESSURE VESSEL WITH SHIELDED CLOSURE MECHANISM

(75) Inventors: Robert B Farmer, Billerica, MA (US); Jonathan A. Talbott, Amherst, NH (US); Mohan Chandra, Merrimack, NH (US); James A. Tseronis, Manchester, NH (US); Heiko D. Moritz, Nashua, NH (US)

(73) Assignee: S. C. Fluids, Inc., Noshua, NH (US)

( * ) Notice: Subject to any disclaimer, the term of this patent is extended or adjusted under 35 U.S.C. 154(b) by 101 days.

(21) Appl. No.: 09/778,124

(22) Filed: Feb. 5, 2001

(65) Prior Publication Data

US 2001/0029971 A1 Oct. 18, 2001

Related U.S. Application Data

(63) Continuation-in-part of application No. 09/632,770, filed on Aug. 4, 2000.
(60) Provisional application No. 60/147,251, filed on Aug. 5, 1999, and provisional application No. 60/155,454, filed on Sep. 20, 1999.

(51) Int. Cl.[7] .................................................. B08B 3/10
(52) U.S. Cl. .................... 134/56 R; 134/95.3; 134/105; 134/140; 134/200; 134/902
(58) Field of Search ............................. 134/94.1, 95.3, 134/105, 140, 141, 143, 148, 149, 153, 162, 182, 183, 186, 200, 902, 56 R, 57 R, 58 R

(56) References Cited

U.S. PATENT DOCUMENTS

| | | |
|---|---|---|
| 3,744,660 A | 7/1973 | Gaines et al. |
| 3,968,885 A | 7/1976 | Hassan et al. |
| 4,355,937 A | 10/1982 | Mack et al. |
| 4,422,651 A | 12/1983 | Platts |
| 4,522,788 A | 6/1985 | Sitek et al. |
| 4,626,509 A | 12/1986 | Lyman |
| 4,789,077 A | 12/1988 | Noe |
| 4,823,976 A | 4/1989 | White, III et al. |
| 4,827,867 A | 5/1989 | Takei et al. |
| 4,879,431 A | 11/1989 | Bertonicini |
| 5,071,023 A | 12/1991 | Perrot |
| 5,071,485 A | 12/1991 | Matthews et al. |
| 5,169,408 A | 12/1992 | Biggerstaff et al. |
| 5,191,993 A | 3/1993 | Wanger et al. |
| 5,221,019 A | 6/1993 | Pechacek et al. |
| 5,224,504 A | 7/1993 | Thompson et al. |
| 5,236,669 A | 8/1993 | Simmons et al. |
| 5,251,776 A | 10/1993 | Morgan, Jr. et al. |

(List continued on next page.)

FOREIGN PATENT DOCUMENTS

| | | | |
|---|---|---|---|
| JP | 60-231330 | * | 11/1985 |
| JP | 1-246835 | | 10/1989 |
| WO | WO 01/33615 A2 | | 5/2001 |
| WO | WO 01/46999 A2 | | 6/2001 |
| WO | WO 01/82368 A2 | | 11/2001 |

OTHER PUBLICATIONS

PCT International Search Report dated May 31, 2001 of International Application No. PCT/US00/03796 filed Feb. 5, 2001.

Primary Examiner—Frankie L. Stinson
(74) Attorney, Agent, or Firm—Maine & Asmus

(57) ABSTRACT

An inverted pressure vessel system for conducting automated industrial processes requiring elevated pressure and temperatures has a vertically movable pedestal for opening and closing the underside loading port, with pedestal drive system and locking mechanism located below the pedestal top and isolated from the chamber opening. The chamber is connectible to a pressure control and process fluid supply system, and has heat exchangers connected to an external source for temperature control. Process fluids are distributed across a central process cavity through divergent inflow and convergent outflow process fluid channels.

17 Claims, 10 Drawing Sheets

U.S. PATENT DOCUMENTS

| | | |
|---|---|---|
| 5,280,693 A | 1/1994 | Heudecker |
| 5,314,574 A | 5/1994 | Takahashi |
| 5,433,334 A | 7/1995 | Reneau |
| 5,571,330 A | 11/1996 | Kyogoku |
| 5,589,224 A | 12/1996 | Tepman et al. |
| 5,621,982 A | 4/1997 | Yamashita et al. |
| 5,706,319 A | 1/1998 | Holtz |
| 5,746,008 A | 5/1998 | Yamashita et al. |
| 5,900,107 A | 5/1999 | Murphy et al. |
| 5,989,342 A | 11/1999 | Ikeda et al. |
| 5,992,680 A | 11/1999 | Smith |
| 6,029,371 A | 2/2000 | Kamikawa et al. |
| 6,053,348 A | 4/2000 | Morch |
| 6,085,935 A | 7/2000 | Malchow et al. |
| 6,097,015 A | 8/2000 | MCullough et al. |

* cited by examiner

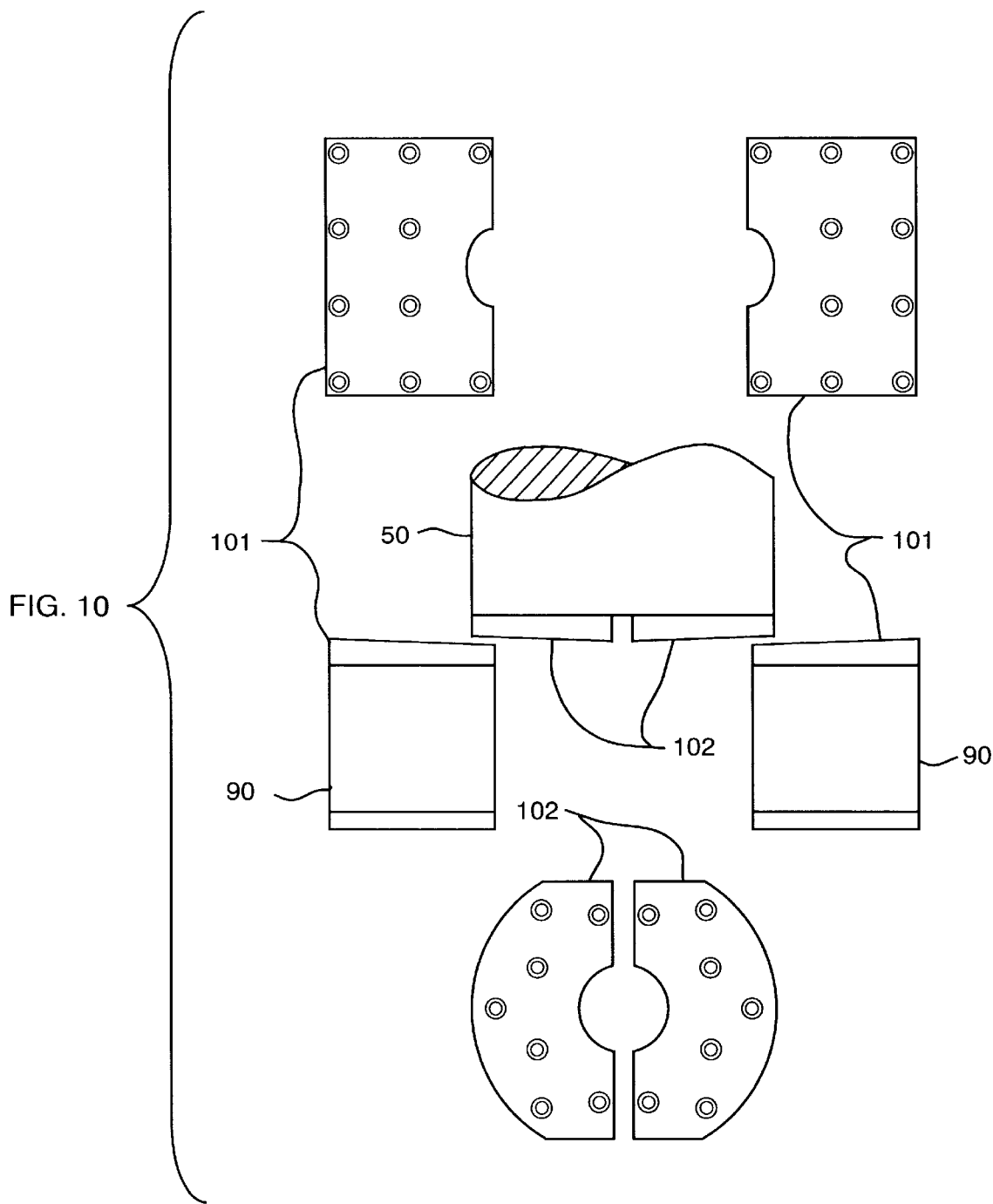

INVERTED PRESSURE VESSEL WITH SHIELDED CLOSURE MECHANISM

CROSS REFERENCE TO RELATED APPLICATIONS

This application is a continuation-in-part of and claims priority to pending U.S. application Ser. No. 09/632,770 filed Aug. 4, 2000, still pending, and prior U.S. provisional patent applications No. 60/147,251 filed Aug. 5, 1999, and No. 60/155,454 filed Sep. 20, 1999.

BACKGROUND OF THE INVENTION

1. Technical Field of the Invention

This invention relates to pressure vessels used in process operations requiring extreme cleanliness and operated at elevated pressures and temperatures, and in particular to pressure vessel design and shielded closure mechanisms that facilitate easier and cleaner loading and closing of pressure vessels used in automated wafer treatment processes in a production environment.

2. Background Art

There is a general requirement in the semiconductor industry, and in other industries as well such as the medical industry, for conducting processes that require enclosures or pressure vessels that can be loaded with wafers or other objects to be processed, permit the admittance and removal of process fluids or materials necessary to the process after the enclosure is sealed, and be elevated and ranged in pressure and temperature. Some processes are much more critical as to contamination, and require quick and close control of temperature, pressure, and the volume and timing of the introduction of process fluids to the pressure vessel. Add to that the demand for conducting these processes in a production mode, and the growing sophistication of the processes themselves, and it is amply clear that improvements in pressure vessels are needed.

This disclosure relates in particular to pressure vessels used in operations requiring extreme cleanliness and operated at elevated or high pressures up to 10,000 psi (pounds per square inch) or more, and further, to pressure vessel design and isolated lid locking mechanisms that facilitate easier and cleaner loading and locking of pressure vessels used in automated wafer treatment processes in a production environment.

An example of a process to which these criteria apply, there is the manufacture of MEMS (Micro Electro Mechanical Systems) devices where the process agent is carbon dioxide, used in both liquid and supercritical form. Other actual and prospective process agents operated in supercritical phase conditions which require much higher temperature and pressure than does carbon dioxide. Other semiconductor related applications with strict cleanliness requirements, such as photoresist stripping, wafer cleaning, particulate removal, dry resist developing, and material deposition, all suffer from the same pressure vessel deficiencies, which include particle generation upon closing that causes contamination, closure mechanisms that are not suited for quick and automated closing, problems with automatically loading and unloading the vessel, and problems with the integration of the apparatus in a production line.

In many laboratory and production setups currently in use, the pressure vessel is loaded by vertical placement through an open top port of the same or larger diameter of the wafers being processed, and is unloaded by reverse action. The vessel is typically closed by manually bolting or mechanically clamping the process vessel flanges and its cover flanges together around the perimeter to form a pressure seal. This apparatus and methodology is both slow and prone to introducing particulate contamination due to the mechanical interface and constant wearing of mating surfaces. The particulate is generated immediately within the loading and processing environment, and inevitably contaminates the materials being processed to some degree.

These contaminants are of particular concern in the semiconductor industry, as even trace amounts are sufficient to plague product quality and production efficiencies. When these perimeter flange latching mechanisms are semi-automated for faster closure or production purposes, the contamination problem is simply placed in a free-running mode that gets progressively worse if unattended.

There are many examples in prior art. One such example is an autoclave with a quick opening door assembly. It typically consists of a chamber flange, a rotating locking ring and the door flange. The door and vessel are clamped and unclamped by the rotation of the locking ring only. As the ring rotates, surfaces of the mating wedges force the chamber flange tight against the gasket providing a leak proof static seal. Due to the contact of the wedges sliding across each other, particles are generated and debris put into motion that eventually contaminate the process beyond acceptable tolerances.

A further problem with traditional pressure vessels in a production environment is the difficulty in adapting them to the standard wafer handling robots of the semiconductor industry. Complex carriage systems are often necessary for automation of the loading and extracting of materials being processed, involving complex transitions between horizontal and vertical transport of the wafers between processing stations. Newer industry standards anticipate and provide for cluster tool arrangements, where rotary transport systems move wafers between connected wafer processing machines. It is this need and this environment to which the following disclosure is addressed.

SUMMARY OF THE INVENTION

It is an object of the invention to provide an inverted pressure vessel system with shielded closure mechanisms for conducting automated industrial processes under elevated pressure and temperatures. To that end, there is disclosed a pressure chamber with an underside loading port, a vertically movable pedestal arranged directly below the pressure chamber for opening and closing the loading port, the top of the pedestal functioning as the floor of the pressure chamber when the pedestal is raised to a closed position and as a loading platform when the pedestal is lowered to an open position.

There is included a motor and vertical drive system for moving the pedestal between open and closed positions, and a pedestal locking system consisting of another motor and lateral drive system for wedge locking the pedestal in a sealing relationship with the pressure chamber so as to define a process volume within which to conduct the processes.

It being another goal to avoid contamination of the processing environment by loosened particles and debris put in motion by the closing and locking systems, there is provided a shield between the loading and unloading area encompassing the pedestal top and pressure chamber, and the pedestal lateral support structure, and vertical drive and closed position locking mechanisms.

It being a further goal to provide for handling processes requiring control of pressure and temperature within the chamber, there is provided an inlet manifold and an outlet manifold communicating with the process volume within the chamber, the manifolds being connectable to a process fluid control source for delivering process fluids under controlled pressure to the process volume and removing byproducts therefrom. There is also provided a heat exchanging platen in the roof of the process volume which is connectible by fluid lines to an external fluid temperature control system, a heat exchanging platen incorporated onto the pedestal and likewise connectible by fluid lines to the external fluid temperature control system, and a thermocouple sensor configured for sensing temperature in the process volume and connectible for communicating with the external fluid temperature control system.

It is yet another goal of the invention to provide for optimal flow and distribution of the process fluids through the central processing cavity of the pressure chamber. To this end, there are provided divergent inflow channels connecting the inlet manifold to the central processing cavity, and convergent outflow channels connecting the cavity to the outlet manifold.

In further support of the goal of reducing contamination of the process, there is a horizontal shelf structure vertically positioned below the top of the pedestal and with a center hole through which the pedestal operates, with lateral support for the pedestal being attached thereto. There is a vertically collapsible bellows, the upper end thereof being attached by an upper bellows flange around the top of the pedestal and the lower end thereof being attached by a lower bellows flange to the perimeter of the hole in the shelf so as to encircle the pedestal and isolate the lateral support structure and drive and lock mechanisms from the loading and processing environment above.

Still other objects and advantages of the present invention will become readily apparent to those skilled in this art from the following detailed description, wherein we have shown and described only a preferred embodiment of the invention, simply by way of illustration of the best mode contemplated by us on carrying out the invention. As will be realized, the invention is capable of other and different embodiments, and its several details are capable of modifications in various obvious respects, all without departing from the invention.

BRIEF DESCRIPTION OF THE DRAWINGS

FIG. 10 is a multi view illustration of the side elevation and plan view aspects of the pedestal locking wedge components of the preferred embodiment.

DESCRIPTION OF THE PREFERRED EMBODIMENT

Figure 1:
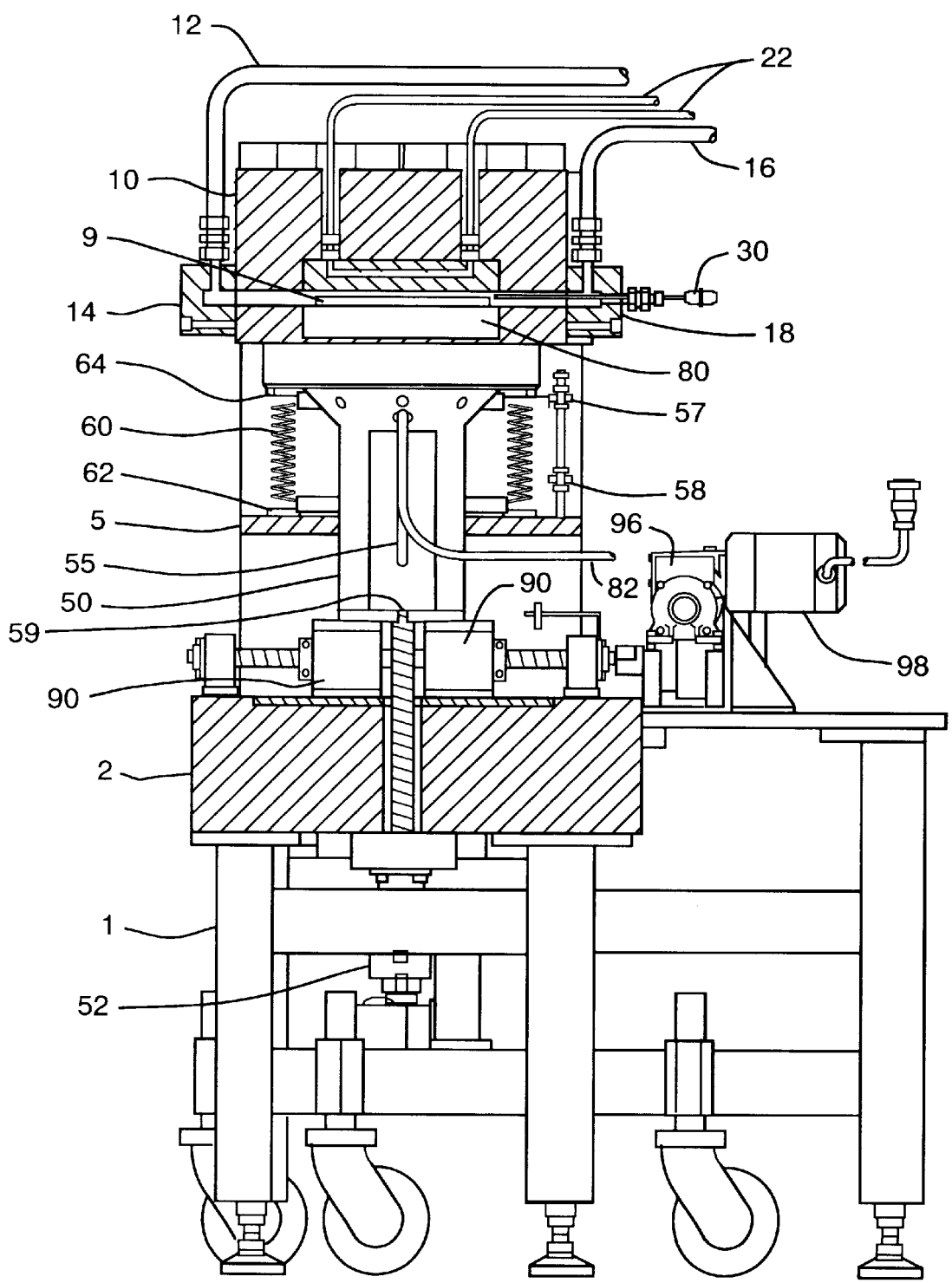
FIG. 1 is a side elevation cross section illustrating the principle components of the preferred embodiment with the pedestal and lock blocks in closed and locked positions, respectively.

To those skilled in the art, the invention admits of many variations. What follows is a description of the preferred embodiment, and should not be construed as limiting the scope of the claims that follow.

The preferred embodiment described herein is a component of a cluster tool arrangement for the production processing of semiconductor wafers or pressure and temperature sensitive treatment of other small articles. It is an inverted pressure vessel with an isolated door closure mechanism, and a specially configured process volume for handling a through flow of processing fluids in a closely controlled temperature and pressure cycling environment. It conforms the cluster tool geometry SEMI/MESC (Semiconductor/Modular Equipment Standards Committee) standards. It contemplates a maximum operating pressure in the order of 4500 psi, (pounds per square inch), and in an embodiment with a cavity design size of 200 millimeters diameter and a total process volume of about three quarters of a liter, the structure is required to resist up to about 400,000 pounds of force from within the process volume. The temperature range of the preferred embodiment is −20 to +150 degrees centigrade. Higher pressures and temperatures may be desired for some processes, and are simply a function of design. No warranty is expressed or implied in this disclosure as to the actual degree of safety, security or support of any particular specimen of the invention in whole or in part, due to differences in actual production designs, materials and use of the invention.

The pressure vessel of the invention is assumed to be connected to a suitable dynamic process supply and control system that supplies process fluid under controlled pressure as required by the process, exerts temperature control via heat exchangers in the processing volume, excepts outflow byproducts of the process for recycling or other suitable disposition, and provides the necessary computer control and operator interface to be integrated into the production process. The pressure vessel and associated systems are configured with industry standard interlocks and safety features appropriate to the process conditions.

The preferred embodiment is configured for a cluster tool arrangement as part of an automated production system for processing semiconductor wafers, as it described below. It is adaptable to other systems for other elevated pressure/temperature processing in an automated system, incorporated into or combined with a horizontal, pass-through conveyor system, a wafer handling robot system, or any other handling system for delivering and loading articles to be processed under pressure, onto the open top of the pedestal. The vertically operated pedestal can carry a wafer cassette, a single wafer, or other object being processed into the pressure vessel for processing, and out again for pickup and further transport. The lift and lock mechanism for operating the pedestal is fully shielded so as to isolate any particulate matter generated and any debris put into motion by the lift and lock mechanism, from the loading and processing environment.

Referring to the figures, an inverted process chamber 10 with an underside loading port, is bolted to front tie plates 3 and rear tie plates 4, which in turn are bolted to lower support plate 2. This assemblage is supported by frame 1. Within this assemblage is arranged a vertically movable pedestal 50, a columnar structure the upper end of which terminates in a large, circular, flat top or loading platform, the same surface of which functions as the floor to inverted pressure chamber 10 when used to close the underside loading port. Pedestal 50 is vertically moveable between an upper closed, and a lower open position relative to process chamber 10. Movement is effected by means of a pedestal drive motor and gearbox 52 mounted in frame 1, which turns a vertically oriented pedestal drive screw 54 in a lift nut 59 in the base of pedestal 50.

Process chamber 10 is machined and configured to provide a final wafer cavity 8 there within, generally sized to accommodate a single wafer diameter and thickness.

Figure 6:
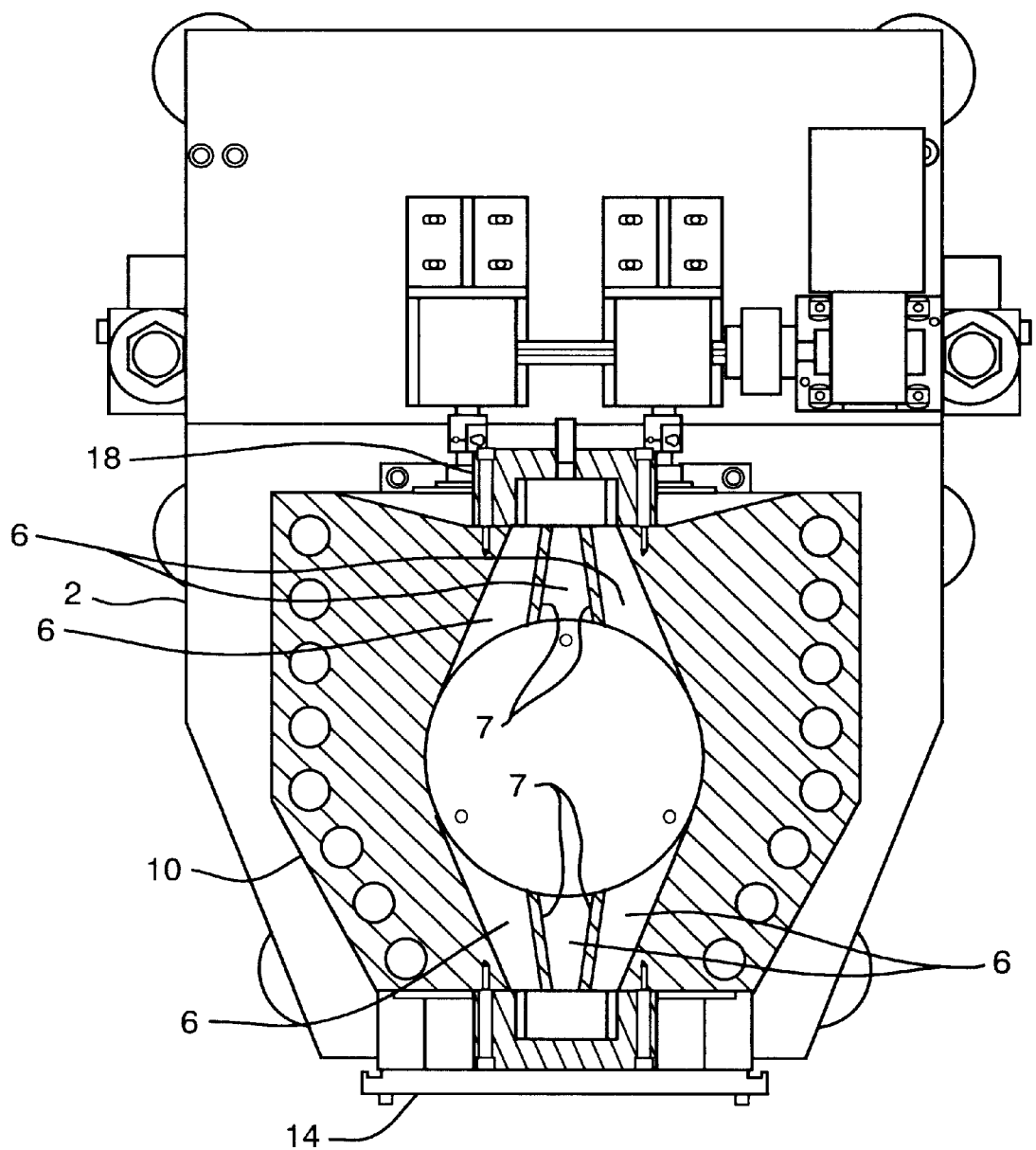
FIG. 6 is a plan view cross section through the process chamber of the preferred embodiment, illustrating the vanes and flow channels affecting the fluid flow through the process volume.

Referring in particular to FIG. 6, flow channels 6, divided by flow vanes 7 promote uniform distribution of process fluids into and out of wafer cavity 8, between inlet and outlet manifolds 14 and 18. The combination of inlet and outlet flow channels 6 and wafer cavity 8 make up the internal process volume of the pressure chamber.

Figure 7:
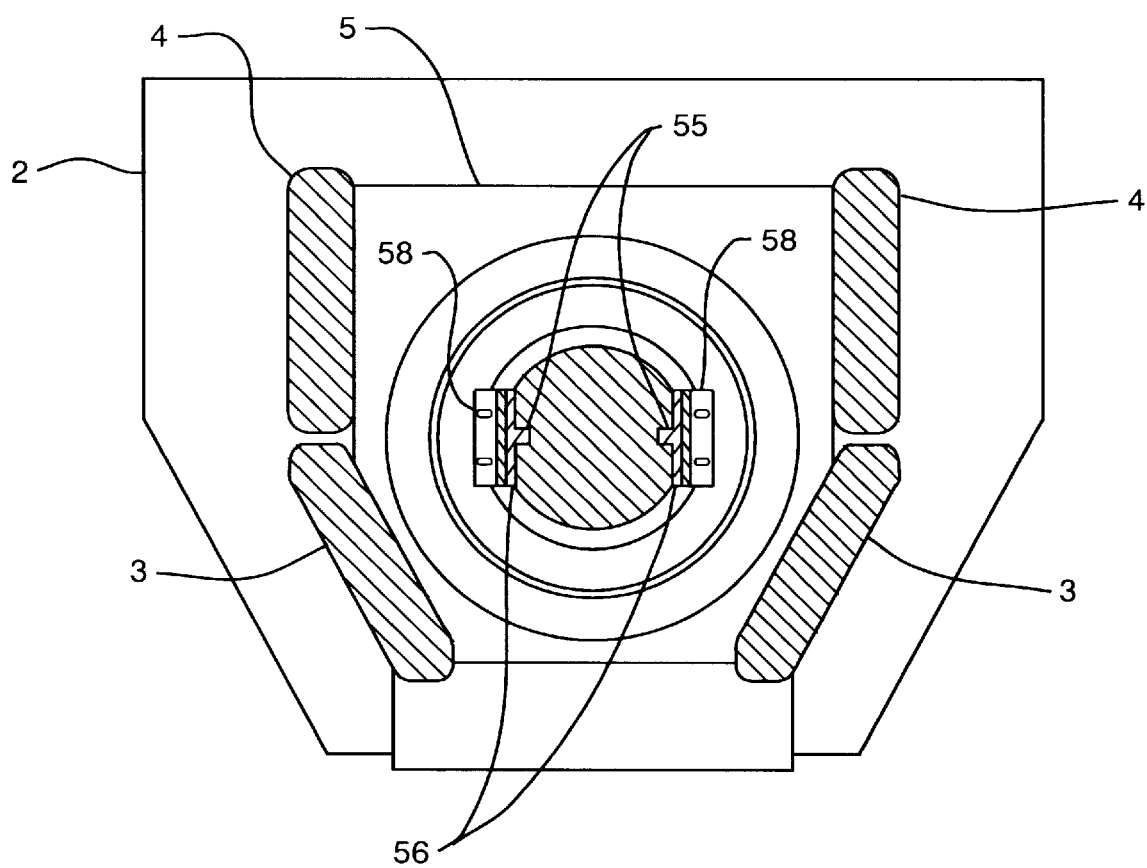
FIG. 7 is a plan view cross section view through the tie plates and pedestal column of the preferred embodiment, illustrating the pedestal guide bars and guide bar holders on each side of the column.

Referring in particular to FIG. 7, pedestal 50 is configured with two opposing flats on its vertical wall, within each of which is machined a vertical channel or groove 55. Lateral support and alignment is provided pedestal 50 throughout its vertical range of motion by opposing bronze pedestal guide bars 56 which closely conform to the cross section of grooves 55, and which are attached to respective adjustable guide bar holders 58 that are in turn mounted on shelf 5. The guide bars are lubricated for a sliding interface.

Shelf 5 divides the region between process chamber 10 and lower support plate 2 into upper and lower compartments, the upper compartment being the region where the loading and unloading of the process chamber occurs, and for which it is important to maintain the highest practical degree of cleanliness to avoid contamination of the process during loading and unloading of the chamber. To that end, bellows 60 is attached by bellows flanges 62 and 64 to shelf 5 and pedestal 50 so as to isolate pedestal and lock block drive systems from the upper compartment.

Figure 2:
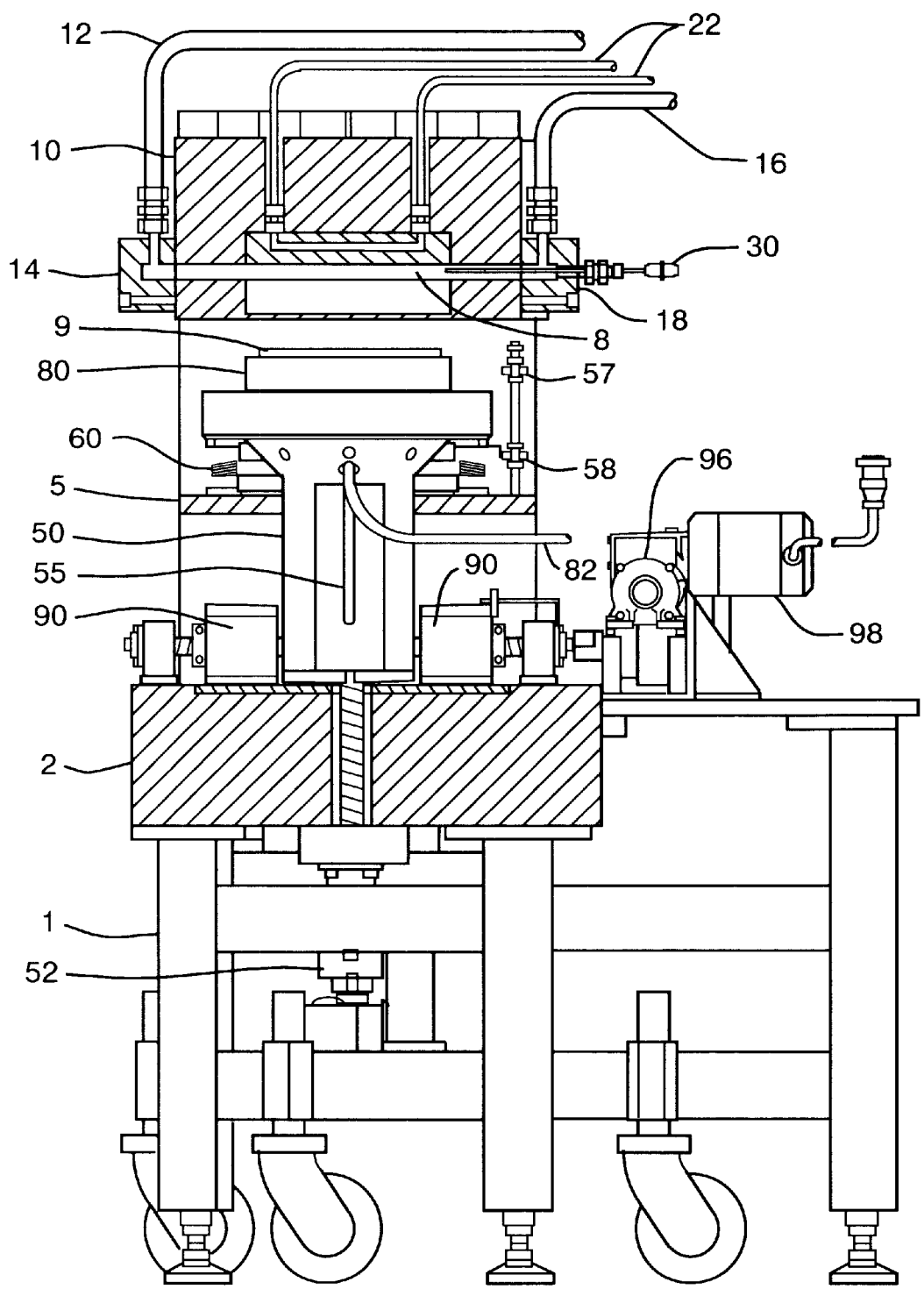
FIG. 2 is a side elevation cross section of the preferred embodiment, with the pedestal and lock blocks in open and retracted positions, respectively.
Figure 3:
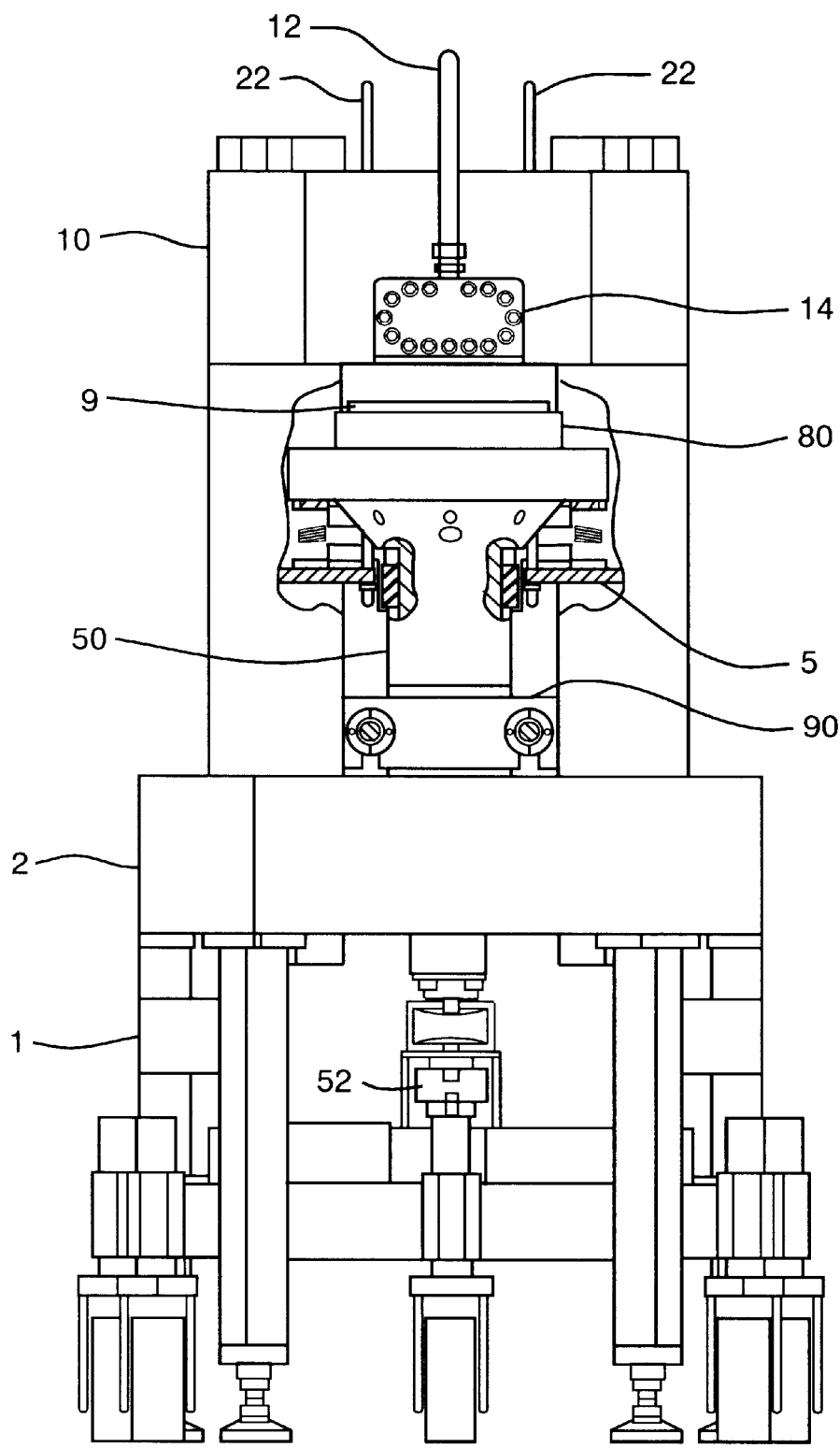
FIG. 3 is a front elevation of the preferred embodiment, partially cut away to illustrate the pedestal in the open position.
Figure 4:
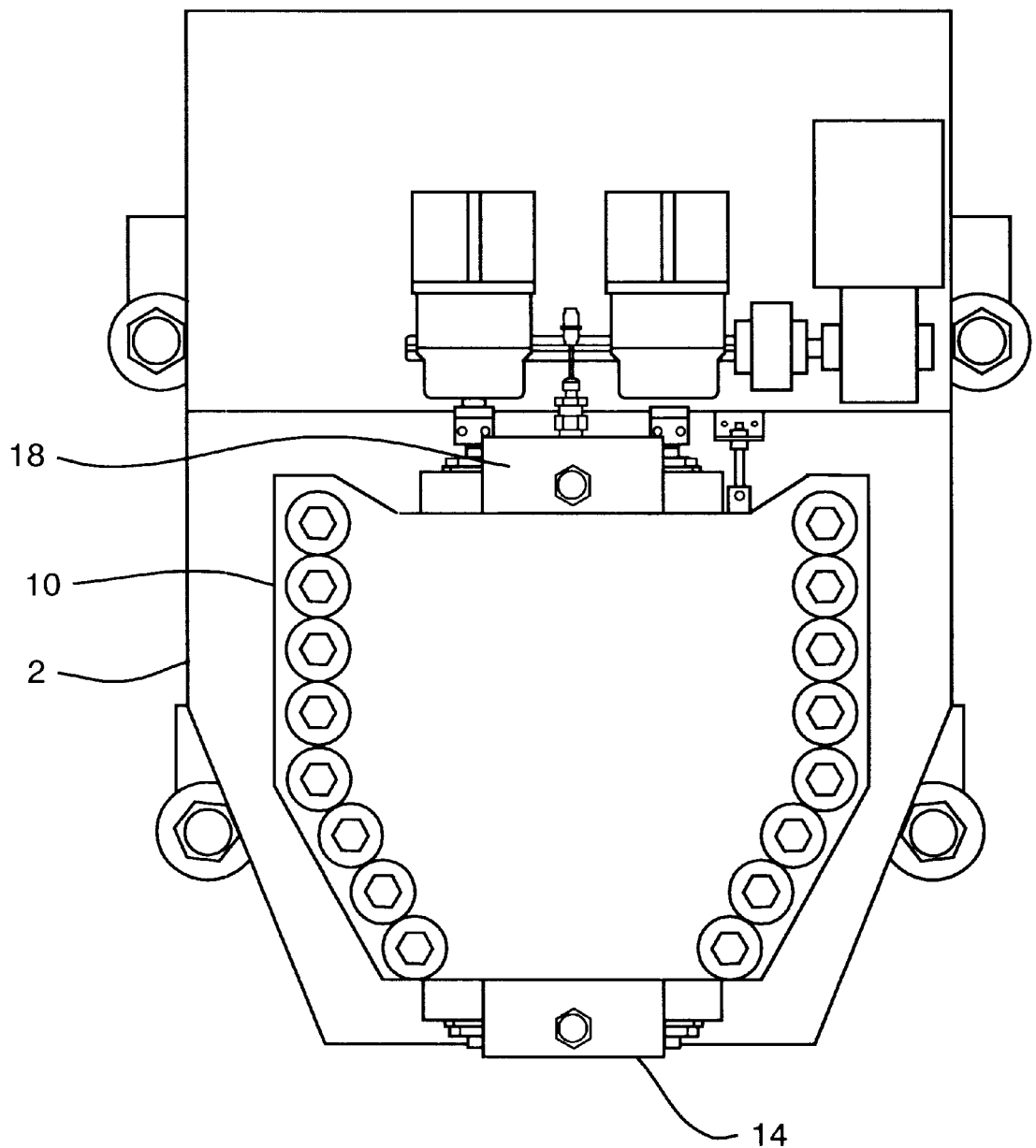
FIG. 4 is a plan view of the preferred embodiment, illustrating the tie plate bolt heads, and the lock block drive screw motor and gearboxes on the backside of the machine.

Referring back to FIGS. 1, 2 and 5, a process fluid inlet line 12 is connected via inlet manifold 14 to the front of chamber 10 so as to provide an inflow path for process fluid into the process volume and wafer cavity 8. A process fluid outlet line 16 is connected via outlet manifold 18 to the back side of process chamber 10 so as to provide an outflow path from the process volume and wafer cavity 8 for byproducts of the process. The fluid inlet and outlet lines are connected to a suitable process fluid supply source for the controlled supply of process fluids under very high pressures. Fluid lines 12 and 16 of the illustrated embodiment are one quarter inch inside diameter, but either or both lines may be larger or smaller, depending on the particular process requirements and the effects of line volume and control valve location with respect to the process volume within the pressure chamber. Either or both manifolds 14 and 18 may be modified to incorporate control valves, with their actuators connected to the process control system.

Figure 8:
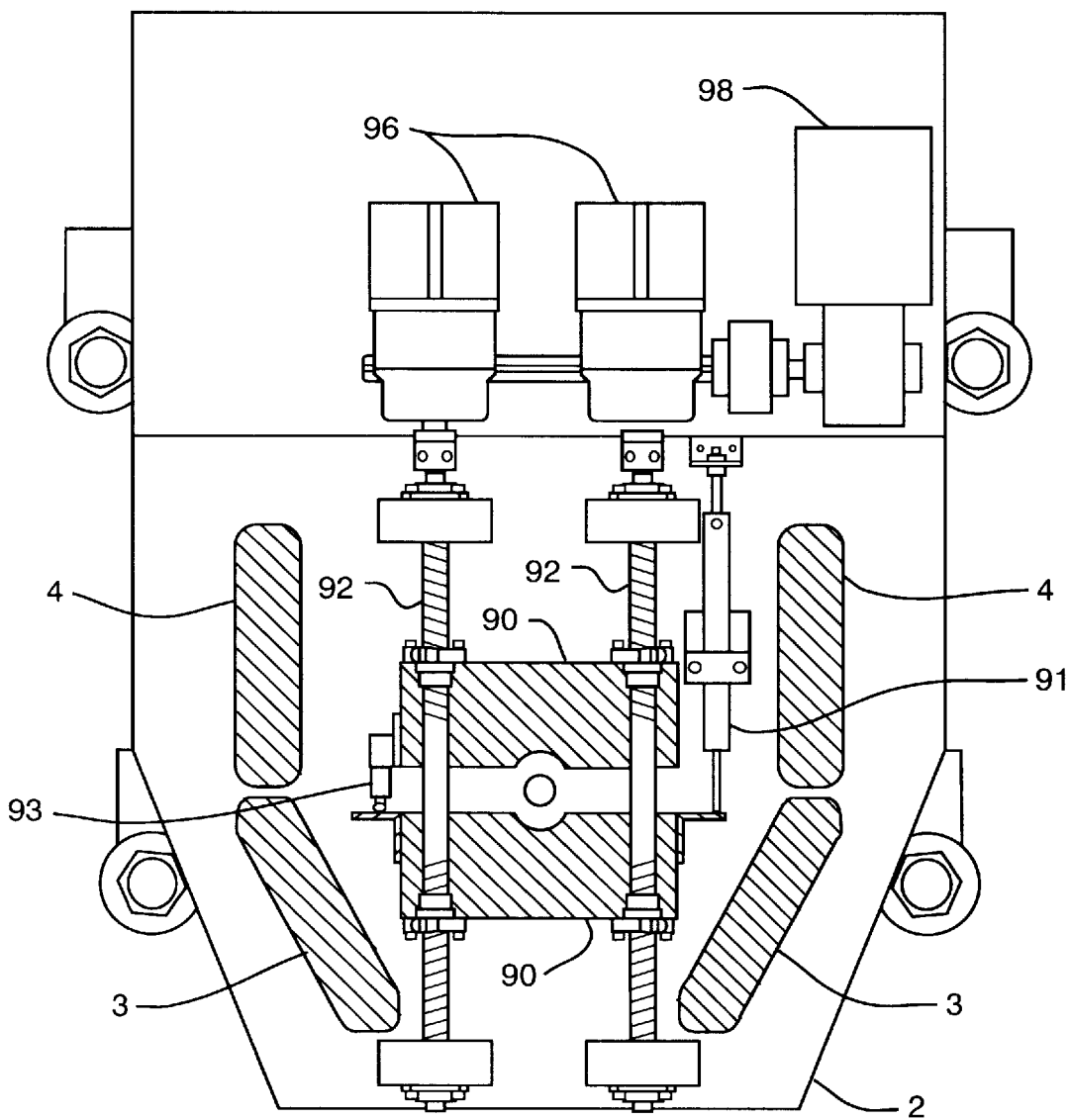
FIG. 8 is a plan view cross section through the tie plates and lock blocks of the preferred embodiment, illustrating the lock block drive system, LVDT sensor and pneumatic position sensor/interlock.
Figure 9:
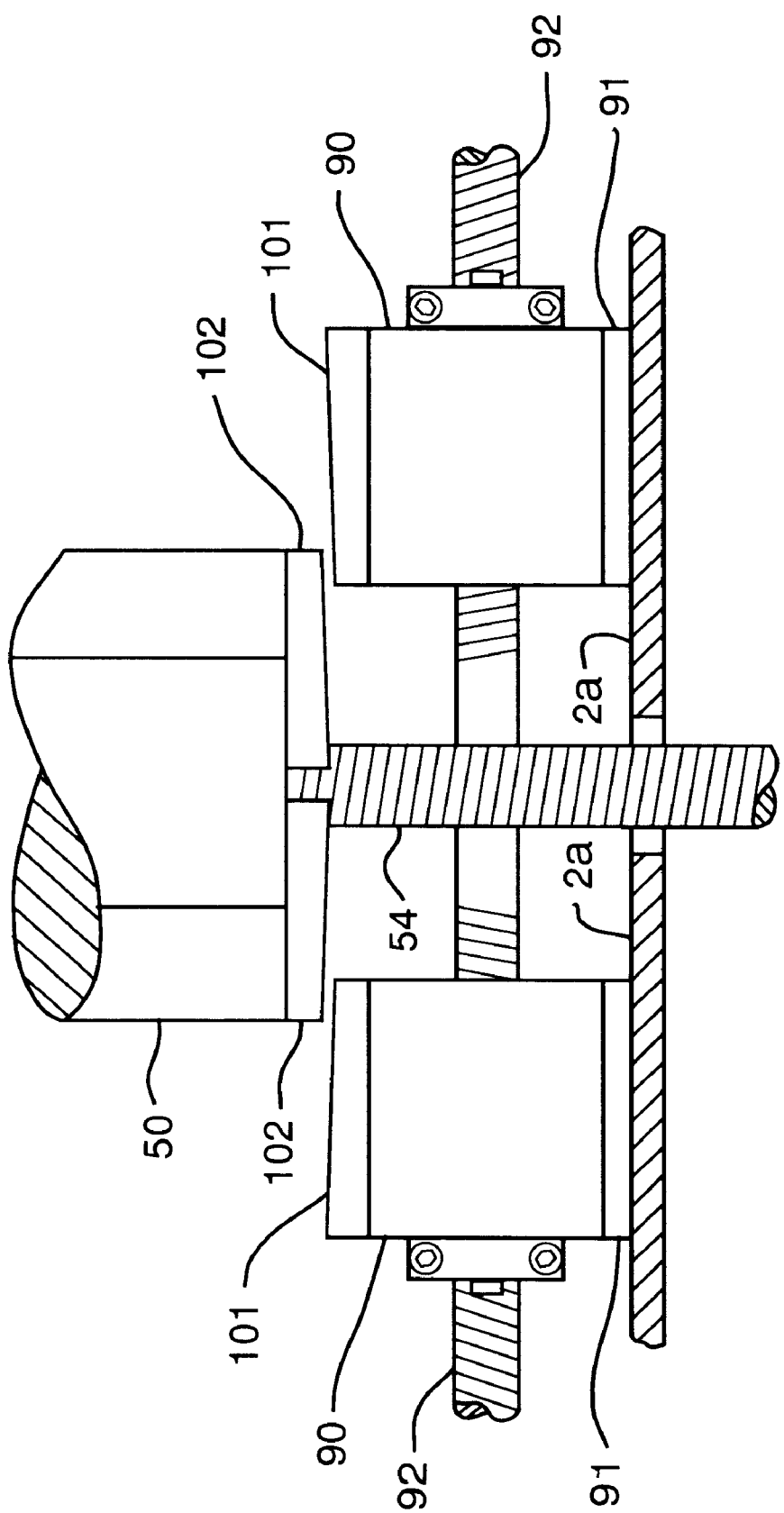
FIG. 9 is a side elevation close up cross section view of the lock blocks and base of the pedestal of the preferred embodiment.

The preferred embodiment employs a motor and lateral drive mechanism for inserting a wedge structure in one form or another beneath the pedestal when it is in the closed position. Referring in particular to FIGS. 8–10, a pair of lock blocks 90 are interlocked by lock block screws 92 for closure from opposing sides of the base of pedestal 50. Lock block screws 92 are supported in screw blocks attached to lower support plate 2 at a height that permits lock blocks 90 to bear and slide on hardened support plates 2A, let into lower support plate 2. Lock blocks 90 are configured with hardened bottom plates 91, which bear on and slide over hardened support plates 2A when lock blocks 90 are operated for movement. As noted above, lock blocks 90 are interlocked by screws 92, and are jointly movable between a retracted position clear of the pedestal's vertical motion, to a locking position beneath the base of pedestal 50 when the pedestal is raised up into a closed position against pressure chamber 10.

Steel hardened locking wedge components 101 and 102, having a two degree angle of ramp or wedge angle, are mounted on the top of the lock block 90 and the base of pedestal 50 respectively, so as to provide a sliding interface with a very high vertical component of force in response to the horizontal closing force applied to lock blocks 90 by the lock block screw motor 98 at low speed/high torque and gear boxes 96. The sliding interface between wedge components 101 and 102 has about a three inch horizontal stroke, provided by the range of motion of locking blocks 90 between open and locked positions. A suitable lubricant can be applied to all sliding interfaces.

The resulting vertical range for the two degree slope wedge angle of wedge components 101 and 102 is in the order of ⅛ inch, so pedestal 50 must be lifted on screw 54 by motor and gearbox 52 to within ⅛ inch of full closure with chamber 10 before locking blocks 90 are actuated. A smaller slope angle can be used to obtain a greater locking force, the vertical component of motion of the locking mechanism being correspondingly smaller.

Upper and lower proximity sensors 57 and 58, attached to a vertical rod mounted on shelf 5 adjacent pedestal 50 so as to sense the edge of the pedestal, control the range of pedestal 50 as driven by motor and gearbox 52. Upon sensing pedestal 50 to be at the upper limit, motor and gearbox 52 are stopped and locking blocks 90 can be actuated for sealing pedestal 50 to process chamber 10. Lift nut 59 is configured with some vertical play within the base of pedestal 50, to avoid placing the pedestal drive screw in tension when locking blocks 90 are engaged.

Referring to FIG. 8, the control mechanism for lock blocks 90 includes an LVDT (linear variable displacement transducer) sensor 91, which is configured to monitor the position of a lock block 90 within its normal range of motion. Lock block drive motor 98 is a two speed, brushless D.C. motor. Lock blocks 90 are driven at high speed/low torque to a predetermined position just short of where wedge components 101 and 102 come into engagement, as sensed by LVDT sensor 91. Motor 98 is then switched to low speed/high torque and driven to the pre-determined final lock position, again as sensed by LVDT sensor 91. Pneumatic interlock valve 93 is engaged when locking blocks 90 are fully closed into the locking position, permitting the process to be initiated within the closed and locked pressure chamber.

Figure 5:
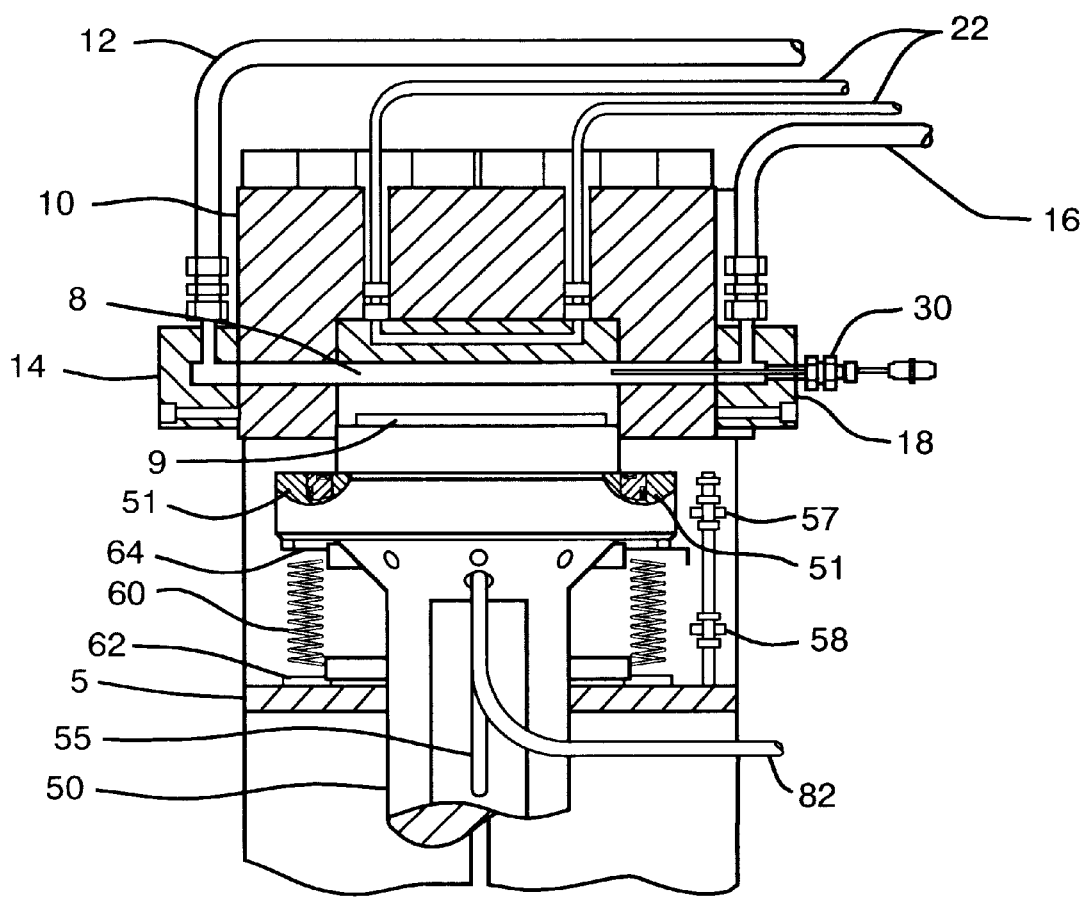
FIG. 5 is a close up side elevation cross section view showing the upper compartment of the preferred embodiment, illustrating the process chamber with process fluid and heating fluid supply lines, with the pedestal and bellows in the mid range position between open and closed.

Referring to FIG. 5, a floating seal 51 embedded in the top of pedestal 50 provides a very high pressure sealing capability for the process volume when the pedestal is raised to the closed position and lock blocks 90 are placed in the locking position. Floating seals are known in the art for having compliant sealing characteristics suitable to the perimeter sealing problem of high pressure processing chambers.

In order to provide quick temperature control of the process volume when the pedestal is closed and locked, there is a heating platen 20 installed in the roof of wafer cavity 8, and a similar heating platen 80 incorporated into pedestal 50. Wafer crib 9 on platen 80 provides for receiving wafers delivered by an automated process, lifting and holding the wafer between the two platens when the chamber is closed for processing, and presenting the processed wafer for automated pickup when the process cycle is complete and the pedestal is lowered. The necessary thermal energy transfer to and from platens 20 and 80 for the temperature control and cycling according to the desired process is accomplished by the circulation of heating/cooling fluid through respective line sets 22 and 82, which are connected to a suitable temperature control system. Process chamber thermocouple 30 is mounted on outlet manifold 18, configured to sense temperature within the process volume of chamber 10, and connects to the process control system.

As will be readily apparent to those skilled in the art, there are many useful embodiments within the scope of the invention. For example, the pedestal may be locked in the closed position by a rotate-to-actuate locking lug ring mounted on the lower support plate, that partially rotates so as to slidingly engage its internally extending wedge lugs with a uniformly spaced set of locking wedge lugs extending outward from around the column of the pedestal, instead of the linear slide block mechanism of the preferred embodiment. The ring and pedestal wedge lugs have a ramped or slightly sloping interface analogous to the lock block wedge components of the preferred embodiment. The rotate to lock mechanism is shielded from the loading and unloading compartment in the same manner as the preferred embodiment, by the shelf and bellows arrangement.

As another example, the pedestal may be of other and various cross sections, including square, channel, or I beam. The pedestal may be hollow or have a rigid skirt over a core element, where the skirt may be configured with a flexible rolling wall diaphragm-like structure with a flange that seals to the shelf to perform the isolating function of the bellows of the preferred embodiment. Another embodiment may have a vertically operable piston diaphragm, more accurately described here as a pedestal skirt diaphragm, sealing the top of the pedestal to the shelf so as to shield or isolate the lateral supports and the drive mechanisms in the same fashion. The shelf embodiment extends to a partial or full enclosure around the mouth or underside port of the pressure chamber, with a door or opening for allowing a transport mechanism to insert and remove articles or wafers being processed from on top of the open pedestal between processing cycles, with a center hole in the bottom of the enclosure through which the pedestal operates, and a pedestal skirt diaphragm sealed to the edge of the center hole to fully contain the loading and unloading environment within the enclosure.

The lateral support structure for the pedestal can be of various configurations so long as it provides continuous lateral support to the vertically movable pedestal structure. Guide bars, channels, and linear bearings are all within the scope of the invention, so long as they are excluded by the shield from exposure to the loading environment of the open pressure chamber along with the vertical driving and lock mechanisms.

As yet another example, the tie plate framework of the preferred embodiment can be configured for bi-directional or pass through access to the loading platform and wafer crib when the pedestal is down and the pressure vessel open, so as to accommodate a horizontal wafer pass-through conveyor system or robotic placement and removal of wafers from opposite sides. Also, particularly suitable for higher pressure systems, the tie plate and bolt system can be replaced with a large closed yoke structure, within which are arranged the inverted pressure chamber and the pedestal and motion systems, so that the yoke provides the structural tie that sustains the closing pressure between the pedestal and the pressure chamber.

As still yet another example, in order to maintain the closing force between the pedestal and the pressure vessel within an acceptable range during extended production cycles, with the aid of the pressure vessel computer control system, data such as pedestal back pressure, lock block motor torque, and lock block closing pressure can be continuously monitored with suitable sensors for trend information which can then be used for making on-the-fly adjustments to start, stop and gear shift positions for lock block motion and pedestal height. As an additional example, the lift mechanism for the pedestal may be hydraulic, threaded screw, or any other manner of jacking or extension mechanisms sufficiently robust to elevate the pedestal weight to the pre-locking closing height, and designed to tolerate the additional small vertical motion of the locking action.

The objects and advantages of the invention may be further realized and attained by means of the instrumentalities and combinations particularly pointed out in the appended claims. Accordingly, the drawing and description are to be regarded as illustrative in nature, and not as restrictive.

We claim:

1. An inverted pressure vessel system with shielded closure mechanisms for conducting automated industrial processes under elevated pressure and temperature, comprising a pressure chamber with an underside loading port, a vertically movable pedestal arranged directly below said pressure chamber for opening and closing said loading port, the top of said pedestal functioning as the floor of said pressure chamber when said pedestal is raised to a closed position and as a loading platform when said pedestal is lowered to an open position, means for moving said pedestal between said open position and said closed position, means for locking said pedestal in a sealing relationship with said pressure vessel so as to define a process volume within which to conduct processes when said pedestal is in said closed position, means for shielding said means for moving and said means for locking from exposure to said top of said pedestal and said pressure chamber, means for controlling pressure within said pressure chamber when closed and sealed, and means for controlling temperature within said pressure chamber when closed and sealed.

2. The inverted pressure vessel system of claim 1, said means for controlling pressure comprising an inlet manifold and an outlet manifold communicating with said process volume, said manifolds being connectable to a process fluid control source for delivering process fluids under controlled pressure to said process volume and removing byproducts therefrom.

3. The inverted pressure vessel system of claim 2, said means for controlling temperature comprising a heat exchanging platen in the roof of said process volume being connectible by fluid lines to an external fluid temperature control system, a heat exchanging platen incorporated onto said pedestal being likewise connectible by fluid lines to said external fluid temperature control system, and a thermocouple sensor configured for sensing temperature in said process volume and connectible for communicating with said external fluid temperature control system.

4. The inverted pressure vessel system of claim 1, said process volume comprising a central cavity, divergent inflow channels connecting said inlet manifold to said cavity, and convergent outflow channels connecting said cavity to said outlet manifold.

5. The inverted pressure vessel system of claim 1, said means for moving comprising a motor and vertical drive mechanism located below and connected to said pedestal and means for providing lateral support to said pedestal, said means for locking comprising a motor and lateral drive mechanism for inserting at least one wedge structure beneath said pedestal when in said closed position.

6. The inverted pressure vessel system of claim 5, said wedge structure comprising a pair of opposing and interlocked locking blocks slidably mounted on a lower support plate, said blocks being jointly laterally movable between a spaced apart unlocked position clear of the range of motion of said pedestal and an adjacent locked position beneath said pedestal, the top surface of said blocks being slidingly engageable at a wedge angle with the bottom of said pedestal.

7. The inverted pressure vessel system of claim 5, said wedge structure comprising a rotate-to-actuate locking lug ring with uniformly spaced internally extending wedge lugs mounted on a lower support plate, said locking lug ring being partially rotable so as to slidingly engage said internally extending lugs at a said wedge angle beneath a uniformly spaced set of locking lugs extending outward from the base of said pedestal.

8. The inverted pressure vessel system of claim 5, further comprising a horizontal shelf structure vertically positioned below said top of said pedestal and above said means for moving and said means for locking, said shelf having a center hole through which said pedestal operates, said means for providing lateral support being attached thereto.

9. The inverted pressure vessel system of claim 8, said means for shielding comprising a vertically collapsible bellows, the upper end thereof being attached by an upper bellows flange around said top of said pedestal and the lower end thereof being attached by a lower bellows flange to said shelf so as to encircle said pedestal and said means for providing lateral support.

10. The inverted pressure vessel system of claim 8, said means for shielding comprising a vertically operable piston diaphragm configured for sealing said top of said pedestal to said shelf.

11. The inverted pressure vessel system of claim 8, said means for providing lateral support comprising two flats on opposing sides of said pedestal with vertical guide channels configured therein, said guide channels engaged with closely conforming stationary guide bars mounted on guide bar holders attached to said shelf.

12. The inverted pressure vessel system of claim 1, said means for shielding comprising
an enclosure about said underside port, said enclosure communicating with a transport mechanism for inserting and removing articles for processing, said enclosure having an underside center hole through which said pedestal operates, and
a pedestal skirt diaphragm the center section of which is sealed about said top of said pedestal, the flange of which is sealed to the edge of said center hole.

13. An inverted pressure vessel system with shielded closure mechanisms for conducting automated industrial processes under elevated pressure and temperature, comprising
a pressure chamber with an underside loading port,
a vertically movable pedestal arranged directly below said pressure chamber for opening and closing said loading port, the top of said pedestal functioning as the floor of said pressure chamber when said pedestal is raised to a closed position and as a loading platform when said pedestal is lowered to an open position,
a horizontal shelf structure vertically positioned below said top of said pedestal and having a center hole through which said pedestal operates,
a motor and vertical drive mechanism located below said shelf and connected to said pedestal,
means for providing lateral support to said pedestal, said means comprising two flats on opposing sides of said pedestal with vertical guide channels configured therein, said guide channels engaged with closely conforming stationary guide bars mounted on guide bar holders attached to said shelf,
a locking mechanism below said shelf consisting of a motor and lateral drive mechanism for inserting at least one wedge structure beneath said pedestal when in said closed position so as to define a sealed process volume within which to conduct said processes,
a vertically collapsible bellows, the upper end thereof being attached by an upper bellows flange around said top of said pedestal and the lower end thereof being attached by a lower bellows flange to said shelf so as to encircle said pedestal and said means for providing lateral support,
an inlet manifold and an outlet manifold communicating with said process volume, said manifolds being connectable to a process fluid control source for delivering process fluids under controlled pressure to said process volume and removing byproducts therefrom,
a heat exchanging platen in the roof of said process volume being connectible by fluid lines to an external fluid temperature control system,
a heat exchanging incorporated onto said pedestal being likewise connectible by fluid lines to said external fluid temperature control system,
a thermocouple sensor configured for sensing temperature in said process volume and connectible for communicating with said external fluid temperature control system, said process volume further comprising a central cavity, divergent inflow channels connecting said inlet manifold to said cavity, and convergent outflow channels connecting said cavity to said outlet manifold.

14. The inverted pressure vessel system of claim 13, said wedge structure comprising a pair of opposing and interlocked locking blocks slidably mounted on a lower support plate, said blocks being jointly laterally movable between a spaced apart unlocked position clear of the range of motion of said pedestal and an adjacent locked position beneath said pedestal, the top surface of said blocks being slidingly engageable at a wedge angle with the bottom of said pedestal.

15. The inverted pressure vessel system of claim 13, said processes including supercritical fluid processing of semiconductor wafers.

16. The inverted pressure vessel system of claim 15, said super critical fluid comprising carbon dioxide.

17. The inverted pressure vessel system of claim 16, incorporated into an automated production system for processing semiconductor wafers.

* * * * *